United States Patent

Bruning et al.

[11] Patent Number: 5,488,514
[45] Date of Patent: Jan. 30, 1996

[54] METHOD OF MOUNTING AN OPTICAL ELEMENT

[75] Inventors: John H. Bruning, Pittsford; Frank A. DeWitt, Holcomb; Keith E. Hanford, Macedon, all of N.Y.

[73] Assignee: General Signal Corporation, Stamford, Conn.

[21] Appl. No.: 404,924

[22] Filed: Mar. 16, 1995

Related U.S. Application Data

[62] Division of Ser. No. 79,976, Jun. 18, 1993, Pat. No. 5,428,482, which is a continuation of Ser. No. 787,785, Nov. 4, 1991, abandoned.

[51] Int. Cl.⁶ ................................................ G02B 7/02
[52] U.S. Cl. ........................... 359/811; 359/819; 359/830
[58] Field of Search .................................. 359/811, 818, 359/819, 827, 830

[56] References Cited

U.S. PATENT DOCUMENTS

| | | |
|---|---|---|
| 2,953,970 | 9/1960 | Maynard . |
| 3,121,605 | 2/1964 | Nunn . |
| 3,762,821 | 10/1973 | Bruning et al. . |
| 4,062,030 | 12/1977 | Starp ........................... 359/827 |
| 4,514,039 | 4/1985 | Kawai . |
| 4,671,624 | 6/1987 | Kahan . |
| 4,778,252 | 10/1988 | Filho ............................ 359/819 |
| 4,796,756 | 1/1989 | Ott . |
| 4,929,054 | 5/1990 | Ahmad et al. ................. 359/819 |
| 4,929,073 | 5/1990 | La Plante et al. ............. 359/819 |
| 5,117,311 | 5/1992 | Nomura ........................ 359/819 |
| 5,210,644 | 5/1993 | Nomura ........................ 359/819 |
| 5,249,197 | 9/1993 | Kittell . |

FOREIGN PATENT DOCUMENTS 230277 1/1986 European Pat. Off. .
57-210306 12/1982 Japan .

OTHER PUBLICATIONS

*Opto–Mechanical Systems Design*, by Paul R. Yoder, Jr., Marcel Dekker, Inc., N.Y., 1986, including pp. 204–209.
"Precision Mechanics", by David Kittell Short Course Notes, Stamford, Ct., 1989, presented i SPIE's International Conferences on Imaging, Fabrication and Competitiveness in Optics, Rochester, N.Y., 1991, including pp. 14, 45.

*Primary Examiner*—Loha Ben
*Attorney, Agent, or Firm*—Eugene Stephens & Associates

[57] ABSTRACT

A mounting seat for an optical element is decoupled from a surrounding annulus that fixes the mount in place in an optical system. The annulus can be one of a plurality of annuli that are interconnected to surround and enclose a coaxial array of optical elements. The decoupling is accomplished by three flexible fingers extending inward from the annulus to a seat for the optical element, which can be mounted either directly on the flexible fingers or on a concentric seating ring supported by the fingers. The flexible elements can be formed integrally with an annulus by cutting slots in its inner perimeter. The flexible elements are structured relative to the lens elements they support so that natural frequencies of vibration of the lens elements are higher than the frequencies of external vibration. The decoupling provided by the flexible fingers absorbs a substantial portion of whatever deforming strain occurs in holding the annulus in place so that such strain does not deform the optical surface of the mounted element.

4 Claims, 7 Drawing Sheets

METHOD OF MOUNTING AN OPTICAL ELEMENT

RELATED APPLICATIONS

This application is a division of allowed parent application Ser. No. 08/079,976, filed 18 Jun. 1993, now U.S. Pat. No. 5,428,482 entitled DECOUPLED MOUNT FOR OPTICAL ELEMENT AND STACKED ANNULI ASSEMBLY, which parent application is a continuation of abandoned grandparent application Ser. No. 07/787,785, filed 4 Nov. 1991, now abandoned entitled DECOUPLED MOUNT FOR OPTICAL ELEMENT AND STACKED ANNULI ASSEMBLY.

BACKGROUND

The need for further miniaturization of micro-circuitry places increased demands on the photolithographic lenses that are used for projection printing the micro-circuitry. Since such lenses are large and complex and contain many optical elements, they present a significant manufacturing challenge to the achievement of finer resolution into the submicron range. Our invention contributes to finer resolution by addressing ways of reducing the distortion involved in mounting optical elements. Although our mounting improvements were made with photolithographic projection lenses in mind, they may also be usable in other optical systems requiring exceptional accuracy in the mounting and assembly of optical elements.

Photolithographic projection lenses have previously been assembled in a traditional way by arranging lens elements and lens support elements within a large lens barrel. Although the barrel can hold a number of elements in place, its presence prevents any direct observation of the exact location of the cell subassemblies within the barrel. It is also especially difficult to go back into the assembled lens for fine adjustments, because many lens elements and their supports may have to be removed to adjust a lens element in the middle of the barrel. Any removed elements cannot be returned exactly to the positions they previously occupied, so that every adjustment of the lens assembly creates accuracy problems.

We have found that these lens barrel difficulties can be avoided by mounting lens elements within individual annuli that are assembled in a stack, without using a lens barrel. This makes the position of each individual element determinable from the position of its annulus; and it becomes somewhat simpler to disassemble the stack by disconnecting one annulus from another, allowing one lens element to be adjusted with minimal disruption of other lens elements. The lens supporting annuli can be accurately machined and carefully interconnected to provide a stable support for the lens elements they contain, and such an assembly of stacked annuli offers possibilities for improving the accuracy of the mountings of the assembled elements.

The stacked annuli approach suffers from a problem not generally experienced in lens barrel assemblies, and this involves inaccuracies introduced by interconnecting the annuli in the stack. We have investigated and have devised a solution for this problem. Our mount allows us to take advantage of the benefits of the stacked annuli approach, while also mounting optical elements to a high degree of accuracy that reduces the degradation of lens imagery and thereby enables more accurate printing of smaller circuit elements.

SUMMARY OF THE INVENTION

Our invention decouples the mounting seat for an optical element from a surrounding and supporting annulus, and the decoupling substantially absorbs and diminishes the transmission of strain from the annulus to the mounting seat. A multi-element lens system can be assembled by our invention by using a plurality of annuli that are interconnected to each other and surround and enclose respective optical elements without requiring a lens barrel. The interconnected annuli assembly and the decoupled mounts for optical elements can be used separately or in combination.

The decoupling is accomplished by three flexible elements extending between a surrounding annulus and the seat for an optical element, whose position depends in part on the characteristics of the flexible elements. The flexible elements and seat that we prefer can be formed integrally with the surrounding annulus to provide a compact and effective decoupling structure. Our decoupled seats for lens elements can be formed within stackable annuli so that the decoupled seats can be made in practical and workable ways, without subjecting the lens elements to undue vibration. In other words, our mounts can insulate optical elements from deforming strain and yet are stiff enough to resist the tendency of the elements to move in response to external vibrations.

Our decoupled mount can apply to refractive lens elements or mirror elements, which we collectively refer to as "optical elements". It can also apply to any mount that uses a seating ring within a surrounding annulus or comparable support that is attached or connected to a structural element of an optical system. Such a connection can secure one annulus to another annulus supporting another optical element or to some other structure intended to fix the location of the optical element within a system.

In assembling stacked or juxtaposed annuli, we arrange a plurality of annuli coaxially and use interconnections to join adjacent annuli so that an optical element can be held within a central opening of each annulus, to arrange the optical elements coaxially. The interconnected annuli then provide a surrounding and supporting structure that encloses the optical elements in lieu of a lens barrel.

Within such an assembly, we support each optical element by three flexible elements extending inward from each respective annulus in the stack, either by mounting the optical element directly on the flexible elements or by mounting the optical element on a ring supported by the flexible elements concentrically within an annulus. Either way, we prefer that the flexible elements be integral with each annulus, although separate rings and separate flexible elements interconnected with the annuli may also be possible.

DRAWINGS

DETAILED DESCRIPTION

Figure 1:
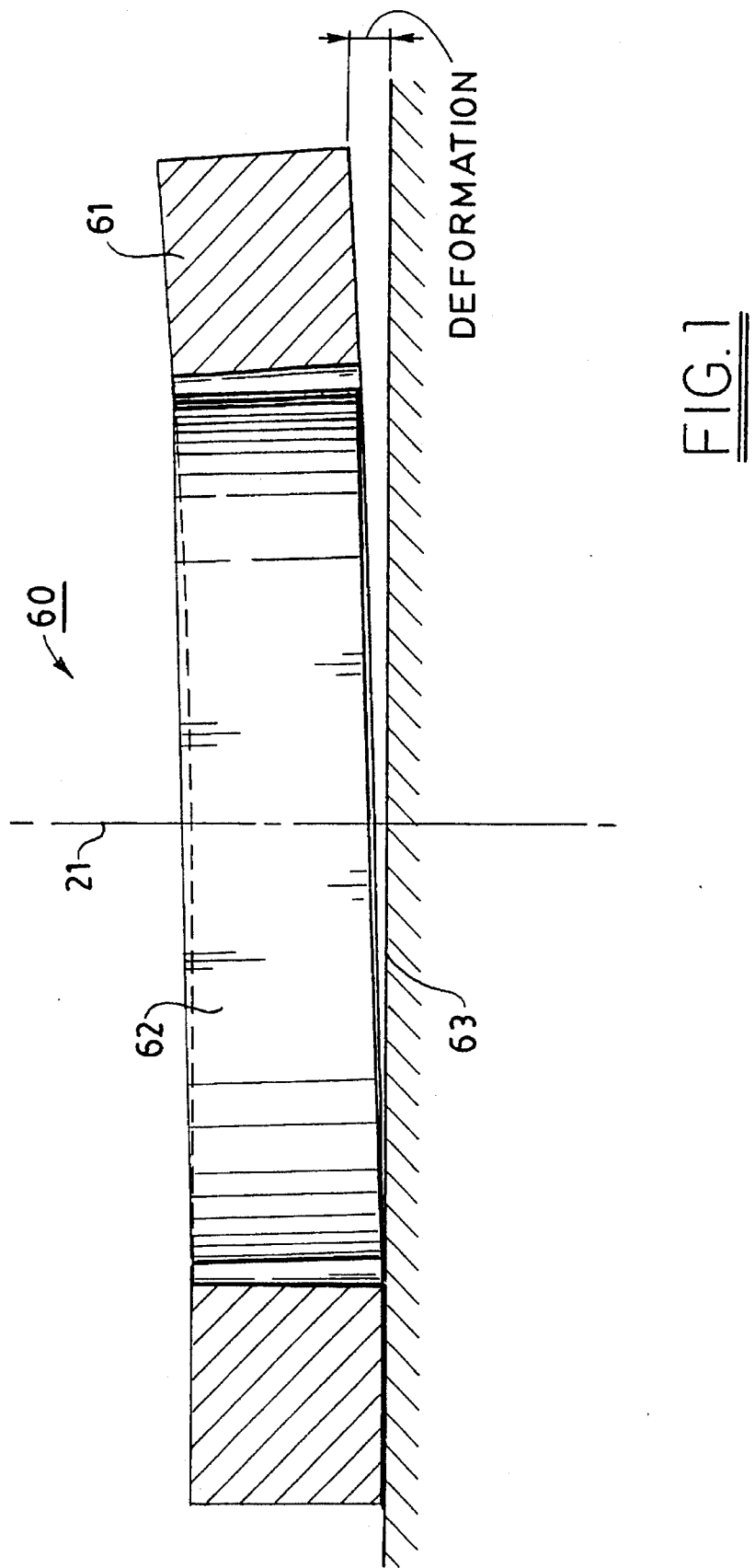
FIG. 1 is a schematic and cross-sectional view exaggerating the effect of deforming force applied to a supporting annulus holding an optical element seat ring that is decoupled according to our invention.

FIG. 1 schematically illustrates, in an exaggerated way, the operation of a decoupled mount 60 for an optical element. Mount 60 includes a supporting annulus 61 connected or attached to a plane position-fixing structure 63, which could be another annulus. An optical element or cell 62 is flexibly mounted within annulus 61 so that element 62 is effectively decoupled from whatever deforming force is applied to annulus 61 when it is fastened in place. The decoupling is accomplished by three flexible elements that, for simplicity, are not shown in FIG. 1.

Annulus 61 is subject to the exaggeratedly illustrated deformation when it is connected to support structure 63. Without a flexible decoupling between annulus 61 and element 62, the deforming strain experienced by annulus 61 would also deform element 62, which would degrade imagery. With a flexible decoupling, element 62 is not deformed, but its plane becomes tilted relative to optical axis 21, and the inaccuracy that this produces is relatively tolerable. The tilting also displaces element 62 slightly along the direction of optical axis 21, causing another inaccuracy that is more tolerable than any deforming of an optical surface.

Practical application of this, as explained below and as shown in the remaining drawings, is applied to our stacked annuli lens assembly using refractive lens elements as the optical components to be mounted in a decoupled way. Our invention also applies, however, to decoupled mounting of mirrors or prisms and can be practiced in assemblies that do not involve stacked annuli.

We prefer that annuli for a lens assembly be machined of steel; and since the typical glass lens elements are round, we prefer that the annuli also be round and sized and configured to surround and support the lens elements. In such an arrangement, the annuli are preferably coaxial, as are the lens elements held respectively within the central openings of the annuli. Doublets, triplets, and even a plurality of independent lens elements can be supported within a single annulus; and the annuli can be interconnected in various ways. One objective is to divide the lens into separable modules involving separable annuli supporting lens elements. This makes disassembly, adjustment, and reassembly much simpler than is possible with conventional lens barrel assembly; and it also facilitates mounting, testing, and determining the assembled location of each lens element. The interconnected annuli also eliminate the need for any lens barrel, since they form a surrounding and supporting structure that encloses the optical elements they hold.

We prefer that the overall lens system be readily separable into subdivisions, which in turn can be disassembled by disconnecting the individual annuli. The interconnections between annuli can be screws, for example, but other fasteners or bonding methods can be used to join annuli. In addition to annuli holding optical elements, the lens assembly can include spacers, centering rings, and other possible structures; and these also can be interconnected with the annuli.

Figure 2:
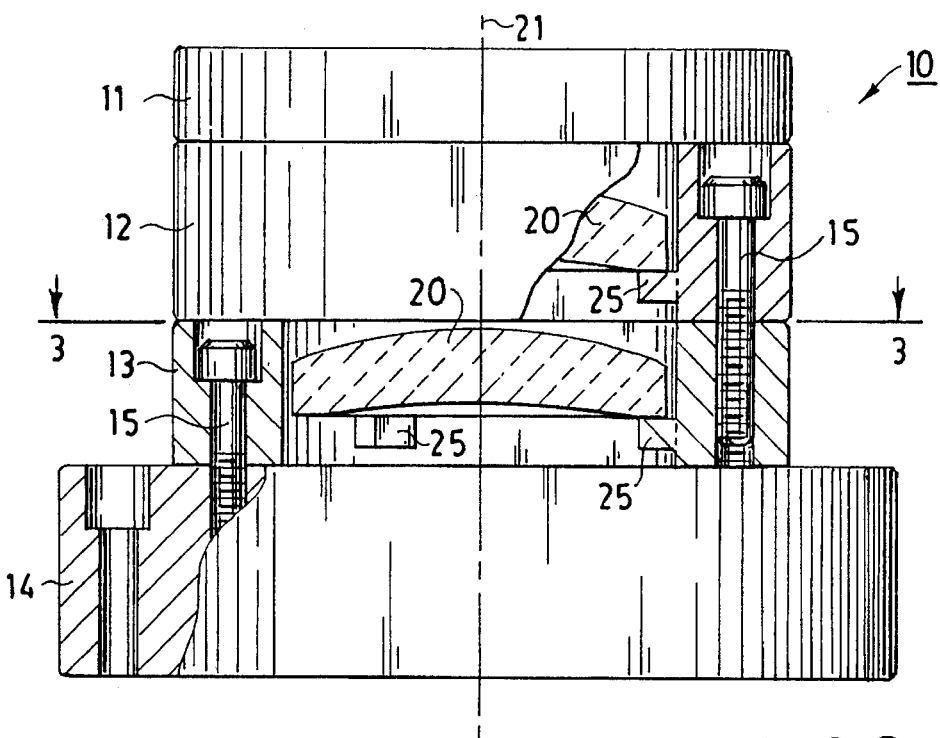
FIG. 2 is a partially cut away and partially schematic elevational view of a portion of a lens using assembled annuli and decoupled mounts according to our invention.

A few of the many possibilities for a stacked assembly of annuli are schematically represented in FIG. 2 by subassembly 10, which includes several annuli 11–14 that vary in diameter and axial extent and are interconnected by screws 15. Annuli 12 and 13 are cut away to show the decoupled mounting of lens elements 20 on schematically represented flexible elements 25.

Figure 3:
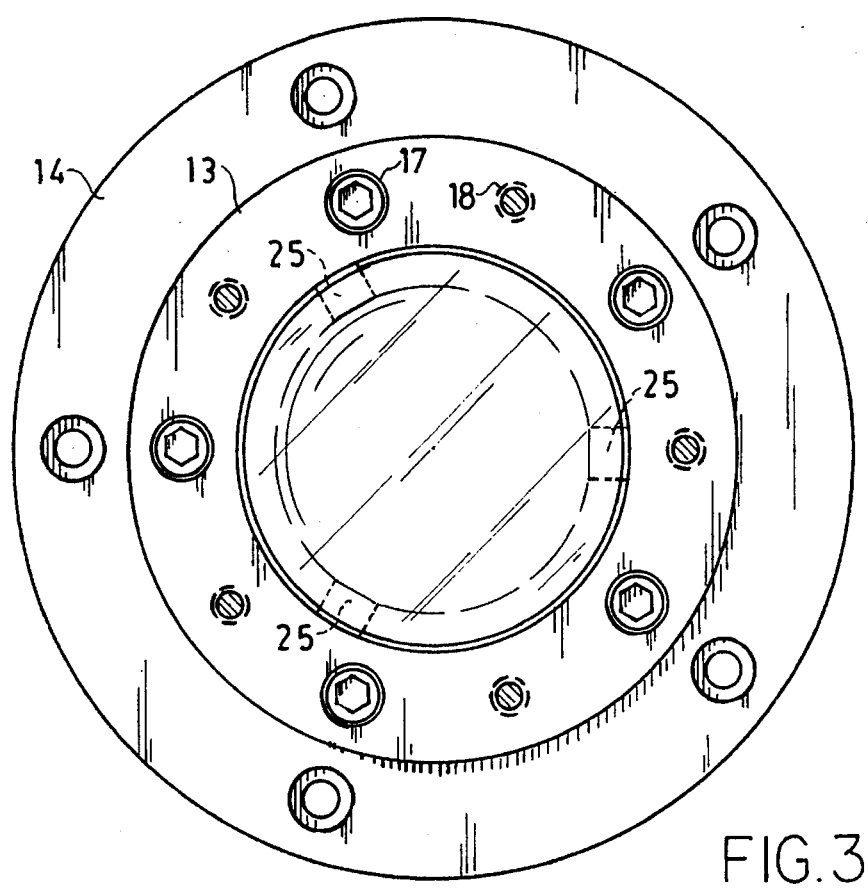
FIG. 3 is a schematic plan view of an annulus such as shown in FIG. 2, having flexible decoupling elements for supporting an optical element.

In the schematic plan view of annulus 13, as shown in FIG. 3, flexible elements 25 are three in number and are equally spaced, at 120° apart, around the inner periphery of annulus 13. Screw holes 17 and 18 also appear in the FIG. 3 view of annulus 13, to receive screws from an adjacent annulus in holes 18 and to accommodate the heads of screws in holes 17. Flexible elements 25 can be made integral with an annulus or made of a separate material joined or fastened to an annulus. Each of the annuli 11–14 can flexibly support one or more lens elements 20 on flexible elements 25. Also, flexible elements 25 can seat a lens element 20 directly as shown in FIG. 2 or via a seating ring, as explained below.

We prefer that each of the flexible decoupling elements 25 be relatively stiff in the direction of optical axis 21 and relatively more flexible in the radial direction within the plane of the surrounding annulus. Three such decoupling elements 25 provide adequate stiffness in the radial direction and are flexible enough to absorb annulus deformations without substantially deforming an optical surface of an element seated within an annulus. We also prefer that a set of three flexible elements 25 have a natural resonant frequency higher than the frequencies of ambient or external vibration, to ensure that any external vibrations that occur in the equipment with which the lens is used will not be at a high enough frequency to vibrate optical element 20 resonantly.

Figure 4:
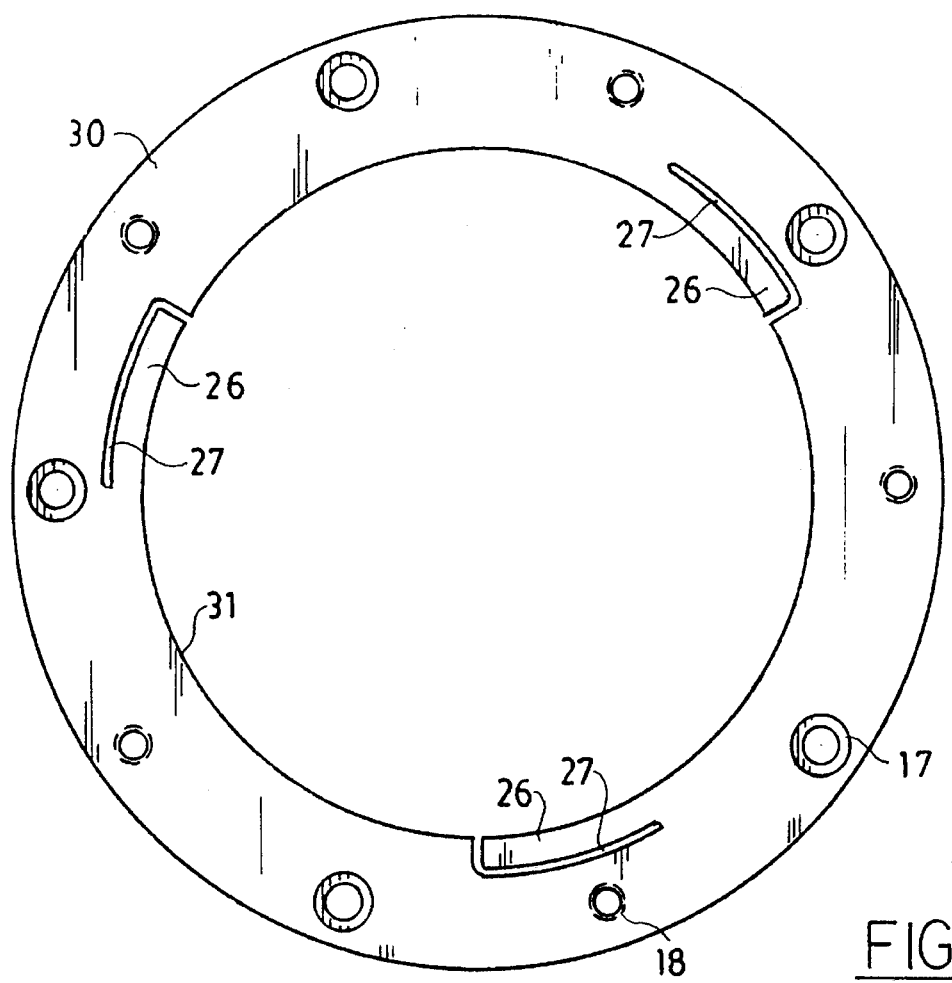
FIG. 4 is a partially schematic plan view of a preferred arrangement of flexible elements for supporting an optical element (not shown in FIG. 4).
Figure 5:
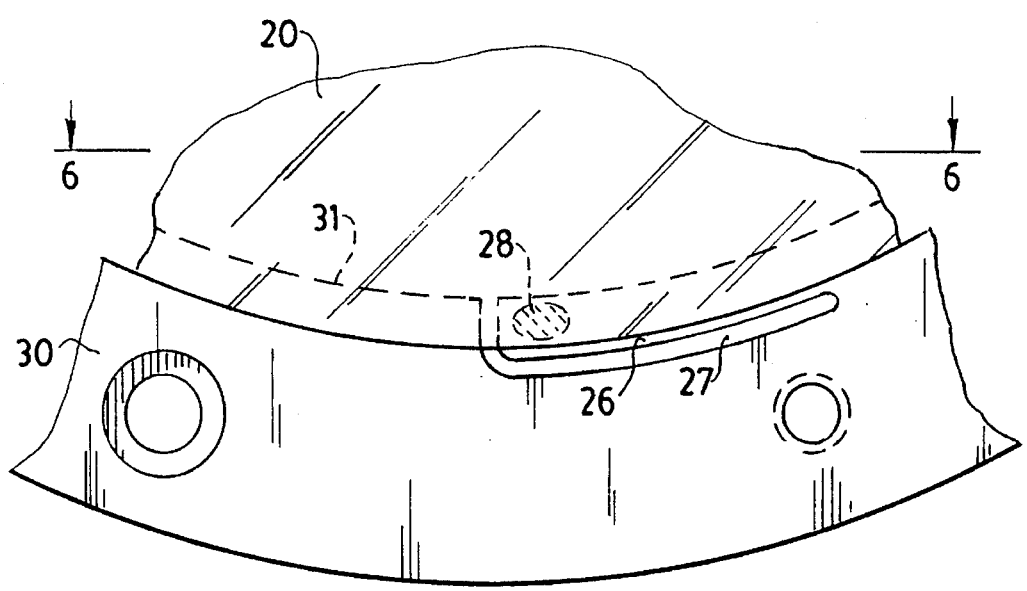
FIG. 5 is an enlarged and cutaway portion of one of the flexible elements shown in FIG. 4 and illustrating a portion of a lens element mounted on the flexible element.
Figure 6:
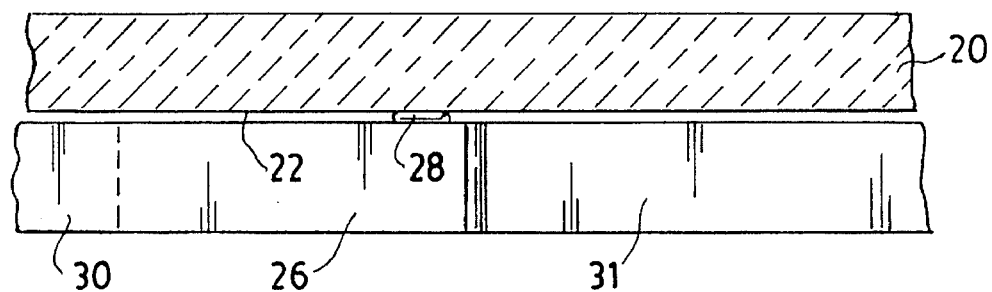
FIG. 6 is a cross-sectional view of the enlarged portion of FIG. 5, taken along the line 6—6 thereof, showing a lens element bonded to a flexible element.

One of our preferred ways of flexibly mounting a lens element 20 within an annulus 30 is schematically shown in FIGS. 4–6. Three flexible fingers 26 are formed by slots 27 cut in the inner perimeter 31 of annulus 30 so that fingers 26 are equally spaced 120° apart around the inside of annulus 30. A relatively thick and rigid lens element 20, which is not readily deformable under its own weight, can then be seated directly on fingers 26. Direct mounting or seating of a lens element 20 on flexible fingers 26 also conserves radial space.

Slots 27 make flexible fingers 26 into cantilevered support beams arranged around the inner perimeter 31 of annulus 30 so that the free or distal ends of fingers 26 can twist and move radially relative to annulus 30 to absorb a portion of the deformation of annulus 30. Lens element 20 is seated slightly above the upper surfaces of fingers 26, by means of a bonding material 28 applied between the distal end of each finger 26 and the bottom rim of lens element 20. This elevates the bottom 22 of lens element 20 not only above fingers 26, but also above the rest of the inner perimeter 31 of annulus 30, so that lens element 20 is free to move slightly as decoupling fingers 26 flex.

Figure 7:
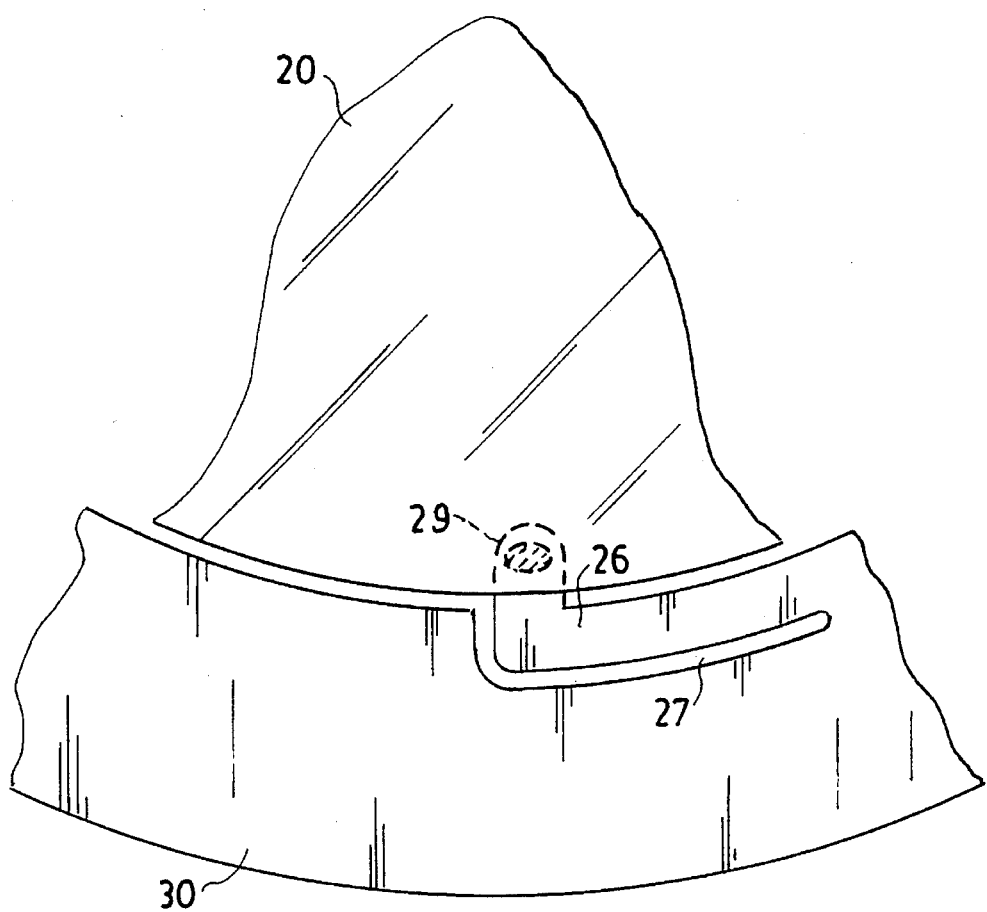
FIG. 7 is an enlarged and cutaway portion, similar to the portion of FIG. 5, illustrating another preferred embodiment of a flexible decoupling element within a supporting annulus.

An alternative arrangement, shown in FIG. 7, provides a radially inward extension 29 from the distal end of flexible finger 26 to support optical element 20 within the inner perimeter of annulus 30. In such a position, element 20 need not be elevated above finger 26 or its extension 29 to clear other portions of annulus 30.

Figure 8:
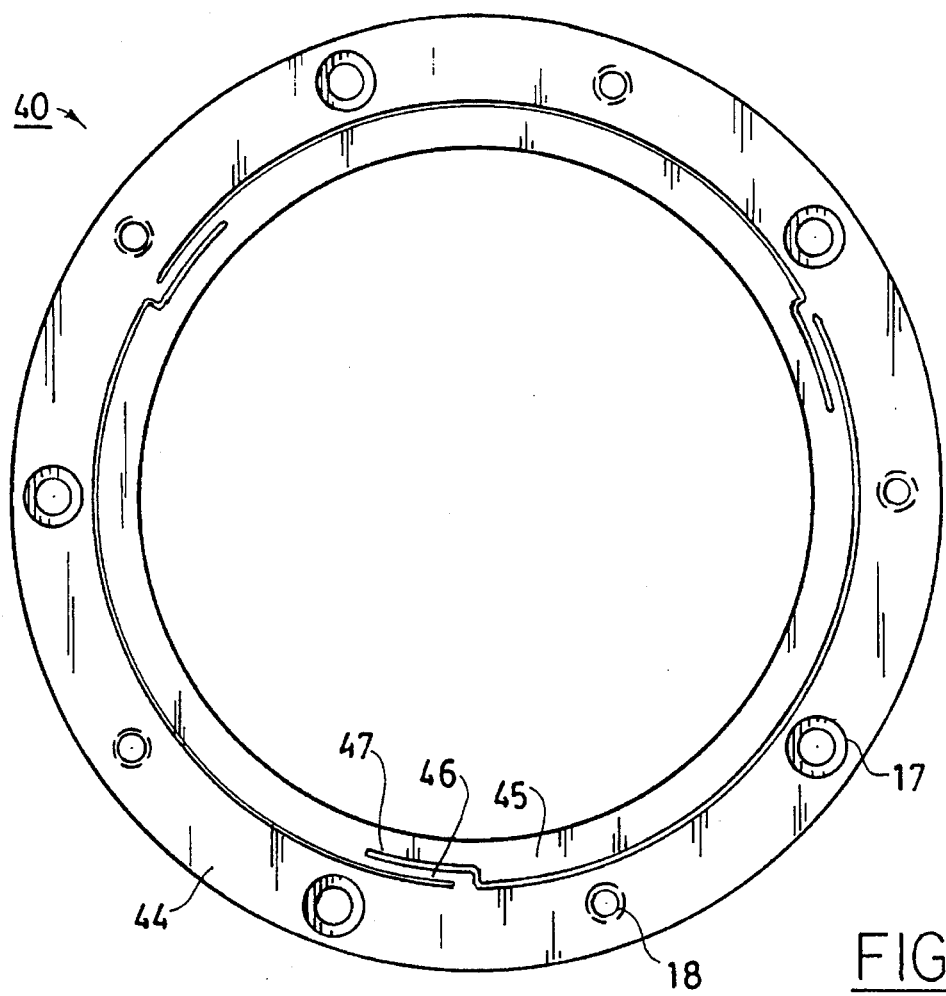
FIG. 8 is a plan view of another preferred embodiment of a decoupled mounting seat formed as a ring flexibly arranged concentrically within an assembly annulus.
Figure 9:
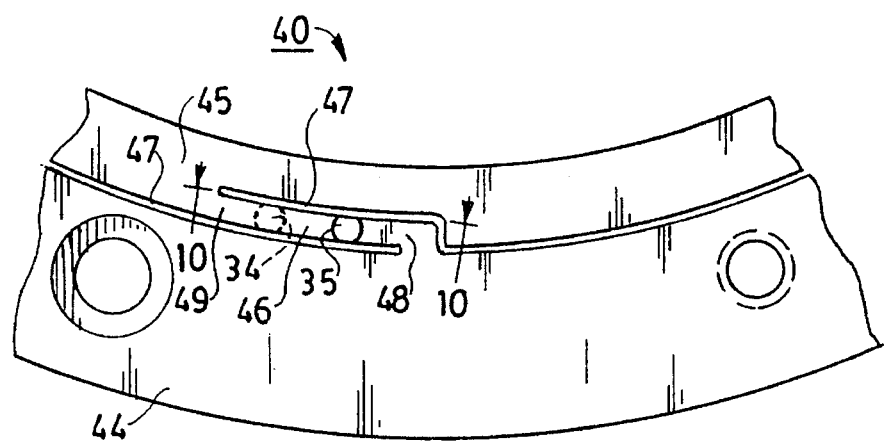
FIG. 9 is an enlarged and cutaway portion of the embodiment of FIG. 8, showing more detail on one of the flexible elements extending between the annulus and the seat ring.
Figure 10:
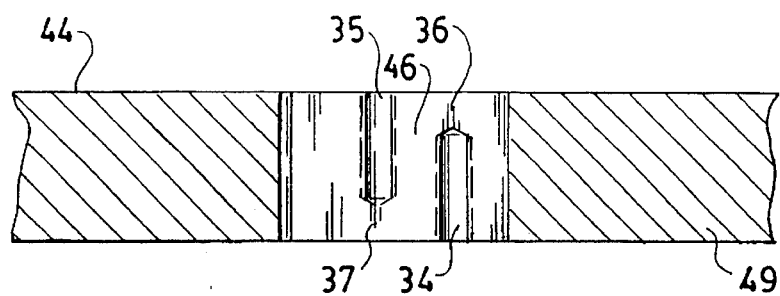
FIG. 10 is a cross-sectional view of the enlarged portion of FIG. 9, taken along the line 10—10 thereof.

Another preferred embodiment of a decoupled lens mount, involving an inner seat ring, is shown in FIGS. 8–10. Annulus 40 is divided by slots 47 into an inner seating ring 45 and an outer mounting ring 44, which are interconnected by flexible decoupling fingers 46. The overlapping configuration of slots 47 leaves flexible fingers 46 extending integrally between the rings and leaves seating ring 45 flexibly concentric within mounting ring 44 and able to provide a decoupled seat for a lens element 20.

More of the preferred structure of decoupling fingers 46 is shown in the enlarged, partial views of FIGS. 9 and 10. Fingers 46 serve as narrow, flexible beams extending between slots 47 and between a fixed or proximal end region 48, where each finger branches off from mounting ring 44, and a flexible, distal end region 49, where each finger 46 branches into seating ring 45.

The flexibility of fingers 46 is predetermined by establishing thickness along their length, as shown in FIG. 10. Relatively thin beams 36 and 37 can be formed in a finger 46 by boring or cutting out recesses 34 and 35, respectively. This is done partly to make the flexibility of finger 46 adequate to ensure that annulus deformation is not transmitted to seating ring 45 sufficiently to deform a lens element 20 mounted there. Proper flexibility characteristics can be given to decoupling fingers 46 in many ways besides the recess configuration illustrated in FIGS. 8–10.

Figure 11:
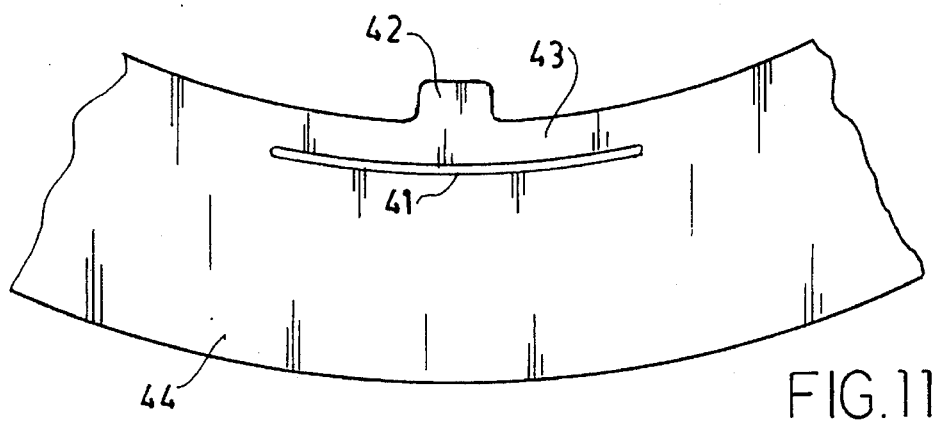
FIGS. 11 and 12 are enlarged and cutaway portions, similar to the view of FIG. 9, illustrating other embodiments of flexible elements formed integrally with a mounting annulus to provide a decoupled seat finger (in FIG. 11) and a decoupled seating ring (in FIG. 12).
Figure 12:
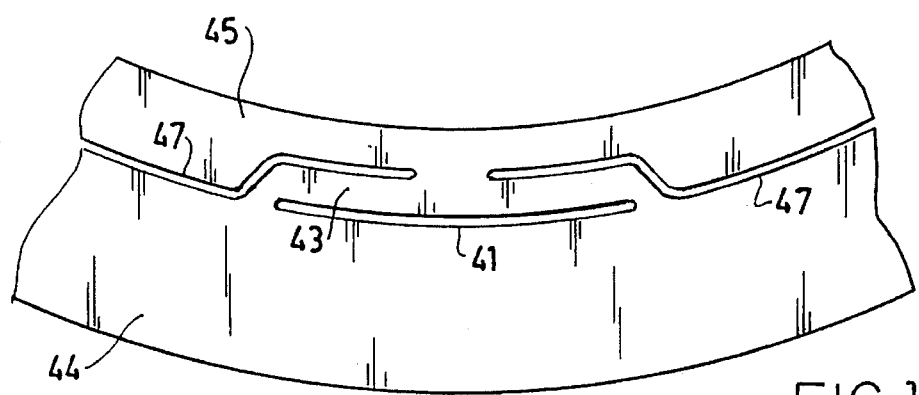

Flexible fingers extending along an inner region of a mounting annulus 44 can be arranged so that their mid-regions support a decoupled seat for an optical element. One such possibility is shown in an illustrated portion of a mounting annulus 44 in FIG. 11, where a slot 41 forms a flexible finger 43 providing a decoupled seat 42 for an optical element (not illustrated in FIG. 11). Another variation, shown in the illustrated portion of a mounting annulus 44 in FIG. 12, uses slots 47, cooperating with slot 41, to form a decoupled seating ring 45 supported by a mid-region of a flexible finger 43. Many variations, other than the illustrated alternatives, are also possible.

Experience with our invention has shown that a seating ring 45 supported by three flexible fingers deforms slightly from the force of gravity. In effect, the regions of ring 45 that are close to the supporting fingers become hills or high regions, and spaces between the fingers become valleys or low regions, as if a small amplitude sine wave were imposed on ring 45. This effect is more pronounced when ring 45 is loaded with the weight of a lens element 20, and the effect is sufficient to deform the optical surfaces of a lens element bonded to ring 45.

Figure 13:
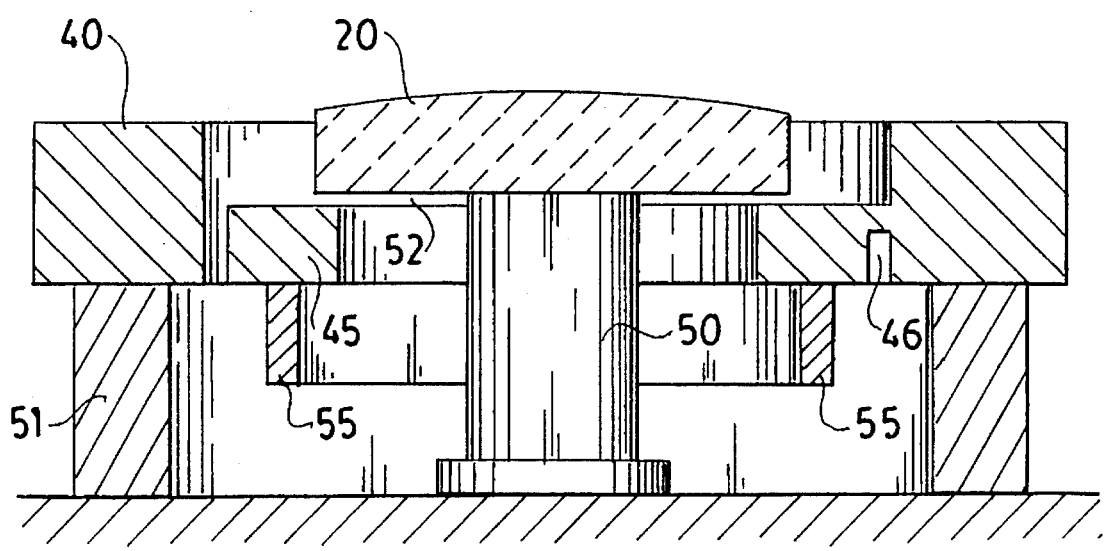
FIG. 13 is a schematic elevation of a preferred method of assembling an optical element on a flexible seat within an assembly annulus, according to our invention.

We have devised an optical element mounting method to counteract this effect and prevent the resulting deformation, and our mounting method is schematically illustrated in FIG. 13. A fixture 50 supports lens element 20 slightly above seating ring 45 supported by flexible fingers 46 within annulus 40, which in turn is supported by fixture 51. A small gap 52 spaces the bottom surface of lens element 20 from seat 45; and because of gravity, gap 52 varies slightly in width around seat 45. Gap 52 is narrowest adjacent each of the supporting fingers 46 and is widest in the spaces between fingers 46.

Before bonding lens element 20 to ring 45, ring 45 is preloaded with weight 55 approximating the weight of lens element 20, and weight 55 is evenly distributed around ring 45. This can be done in a variety of ways, including weight rings 55 made pendant from ring 45 as illustrated or placed on top of ring 45. Once ring 45 is preloaded with the approximate weight of lens element 20, adhesive material is introduced into gap 52 to fill gap 52 fully.

After the bond has set and lens element 20 is secured to seat 45, weight 55 is removed and fixture 50 is removed, leaving seat 45 again subject to the weight of lens element 20. This returns seat ring 45 to the gravitational position it assumed during the bonding process, to hold lens element 20 free of gravity-induced strain.

We claim:

1. A method of mounting an optical element, said method using a seating ring flexibly held within an annulus by three flexible elements extending between the ring and the annulus, and said method comprising:

a. arranging said optical element on a fixture that holds said optical element coaxially adjacent said seating ring;

b. preloading said seating ring with weight approximating the weight of said optical element;

c. bonding said optical element to said seating ring while said fixture supports said optical element and said seating ring upholds said preload weight; and d. removing said preload weight from said seating ring and removing said fixture from said optical element to leave said seating ring supporting said optical element.

2. The method of claim 1 including arranging said annulus in a horizontal plane, arranging said fixture to hold said optical element slightly above said seating ring, and distributing said preload weight uniformly around said seating ring.

3. The method of claim 2 including filling the variable width of a gap between said seating ring and said optical element with a bonding material.

4. The method of claim 1 including bonding said optical element radially within said seating ring.

\* \* \* \* \*